United States Patent
Lee

(10) Patent No.: US 11,264,062 B2
(45) Date of Patent: Mar. 1, 2022

(54) ELECTRONIC DEVICES FOR EXECUTING A WRITE OPERATION

(71) Applicant: SK hynix Inc., Icheon-si (KR)

(72) Inventor: Jeong Jun Lee, Gwangju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/017,294

(22) Filed: Sep. 10, 2020

(65) Prior Publication Data

US 2021/0375334 A1    Dec. 2, 2021

(30) Foreign Application Priority Data

Jun. 2, 2020   (KR) .................. 10-2020-0066623

(51) Int. Cl.
  *G11C 7/10*   (2006.01)
(52) U.S. Cl.
  CPC .......... *G11C 7/1009* (2013.01); *G11C 7/1084* (2013.01); *G11C 7/1087* (2013.01); *G11C 7/1096* (2013.01)
(58) Field of Classification Search
  CPC ... G11C 7/1009; G11C 7/1087; G11C 7/1096; G11C 7/1084
  See application file for complete search history.

(56) References Cited

U.S. PATENT DOCUMENTS

| | | | | |
|---|---|---|---|---|
| 2001/0047464 | A1* | 11/2001 | Shinozaki | G11C 7/1057 711/167 |
| 2009/0016123 | A1* | 1/2009 | Yanagida | G11C 11/4076 365/191 |
| 2016/0179377 | A1* | 6/2016 | Yoon | G06F 3/0604 711/154 |

FOREIGN PATENT DOCUMENTS

| | | |
|---|---|---|
| KR | 1020050106574 A | 11/2005 |
| KR | 1020160076889 A | 7/2016 |

* cited by examiner

*Primary Examiner* — Ajay Ojha
(74) *Attorney, Agent, or Firm* — William Park & Associates Ltd.

(57) ABSTRACT

An electronic device includes an operation control circuit and an input data generation circuit. The operation control circuit generates a detection signal and an internal masking signal based on a masking signal and data during a write operation. The input data generation circuit converts input data based on the internal masking signal to generate converted data. In addition, the input data generation circuit selects and outputs either the converted data or drive data as the input data, which are input to a data storage circuit, based on the detection signal.

18 Claims, 13 Drawing Sheets

ELECTRONIC DEVICES FOR EXECUTING A WRITE OPERATION

CROSS-REFERENCE TO RELATED APPLICATIONS

The present application claims priority under 35 U.S.C 119(a) to Korean Application No. 10-2020-0066623, filed on Jun. 2, 2020, which is incorporated herein by reference in its entirety.

BACKGROUND

1. Technical Field

Embodiments of the present disclosure relate to electronic devices performing a write operation.

2. Related Art

Semiconductor devices among electronic devices may perform a write operation that stores data, which are output from a controller, into a cell array. The semiconductor devices may receive a masking signal from the controller to perform a data masking operation that inhibits some of the data from being stored into the cell array during the write operation. Thus, the semiconductor devices may perform the data masking operation during the write operation to store only desired data among the data provided by the controller into the cell array.

SUMMARY

According to an embodiment, an electronic device may include an operation control circuit and an input data generation circuit. The operation control circuit may be configured to generate a detection signal and an internal masking signal based on a masking signal and data during a write operation. The input data generation circuit may be configured to convert input data based on the internal masking signal to generate converted data. In addition, the input data generation circuit may be configured to select and output either the converted data or drive data as the input data, which are input to a data storage circuit, based on the detection signal.

According to another embodiment, an electronic device may include a data comparison circuit, an operation control signal generation circuit, and a data conversion circuit. The data comparison circuit may be configured to detect a pattern of data based on a masking signal to generate a detection signal when the data have a predetermined pattern. The operation control signal generation circuit may be configured to generate an internal masking signal from the masking signal based on the detection signal. The data conversion circuit may be configured to convert input data based on the internal masking signal to generate converted data.

DETAILED DESCRIPTION

In the description of the following embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
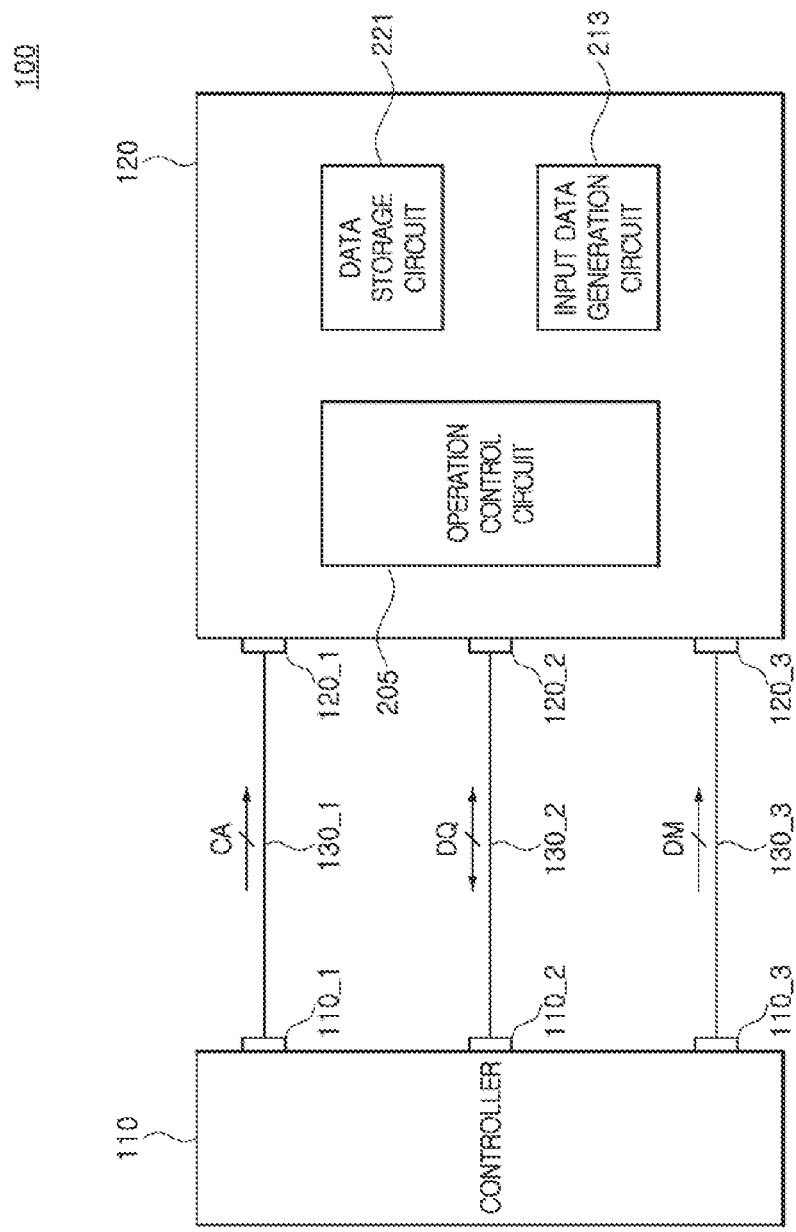
FIG. 1 is a block diagram illustrating a configuration of an electronic system according to an embodiment of the present disclosure.

FIG. 1 is a block diagram illustrating a configuration of an electronic system 100 according to an embodiment of the present disclosure. As illustrated in FIG. 1, the electronic system 100 may include a controller 110 and an electronic device 120. The controller 110 may include a first control pin 110_1, a second control pin 110_2, and a third control pin 110_3. The electronic device 120 may include a first device pin 120_1, a second device pin 120_2, and a third device pin 120_3. The controller 110 may transmit a command/address signal CA to the electronic device 120 through a first transmission line 130_1 connecting the first control pin 110_1 to the first device pin 120_1. The controller 110 may transmit data DQ to the electronic device 120 or may receive the data DQ from the electronic device 120 through a second transmission line 130_2 connecting the second control pin 110_2 to the second device pin 120_2. The controller 110 may transmit a masking signal DM to the electronic device 120 through a third transmission line 130_3 connecting the third control pin 110_3 to the third device pin 120_3. The masking signal DM may be a signal for performing a data masking operation inhibiting the data DQ input to the electronic device 120 from being stored into a cell array (223 or 225 of FIG. 2).

The electronic device 120 may include an operation control circuit 205, an input data generation circuit 213, and a data storage circuit 221. The electronic device 120 may be realized using a semiconductor device. The electronic device 120 may receive the command/address signal CA, the data DQ, and the masking signal DM from the controller 110 to perform various internal operations such as a normal write operation and the data masking operation. When a pattern of the data DQ input to the electronic device 120 is a predetermined pattern during a write operation, the electronic device 120 may activate the data masking operation and may include the operation control circuit 205 that controls an operation that converts input data (D_IN of FIG. 2) latched during a previous write operation. The electronic device 120 may include the input data generation circuit 213 that performs the operation converting the input data (D_IN of FIG. 2) latched during the previous write operation to generate the input data (D_IN of FIG. 2). The electronic device 120 may include data storage circuit 221 that stores the input data (D_IN of FIG. 2) into the cell array (223 or 225 of FIG. 2).

The electronic device 120 may receive the masking signal DM inactivated during the write operation to perform the normal write operation storing the data DQ into the cell array (223 or 225 of FIG. 2) when a pattern of the data DQ input to the electronic device 120 is not the predetermined pattern. The electronic device 120 may receive the masking signal DM inactivated during the write operation to perform the data masking operation inhibiting the data DQ input to the electronic device 120 from being stored into the cell array (223 or 225 of FIG. 2) when a pattern of the data DQ input to the electronic device 120 is the predetermined pattern and may convert the input data (D_IN of FIG. 2) latched during the previous write operation to store the converted input data into the cell array (223 or 225 of FIG. 2). The electronic device 120 may perform the data masking operation inhibiting the data DQ input to the electronic device 120 from being stored into the cell array (223 or 225 of FIG. 2) when the masking signal DM activated during the write operation is input to the electronic device 120.

The electronic device 120 may simultaneously perform the normal write operation and the data masking operation when the write operation is performed. For example, the electronic device 120 may receive data DQ<1:128> having 128 bits and a masking signal DM<1:8> having 8 bits from the controller 110. The electronic device 120 may receive a first masking signal DM<1> inactivated to perform the normal write operation storing first data DQ<1:16> into the cell array (223 or 225 of FIG. 2) when a pattern of the first data DQ<1:16> input to the electronic device 120 is not the predetermined pattern. The electronic device 120 may receive a second masking signal DM<2> inactivated to perform the data masking operation inhibiting second data DQ<17:32> input to the electronic device 120 from being stored into the cell array (223 or 225 of FIG. 2) when a pattern of the second data DQ<17:32> input to the electronic device 120 is the predetermined pattern and may convert the input data (D_IN of FIG. 2) latched during the previous write operation to store the converted input data into the cell array (223 or 225 of FIG. 2). The electronic device 120 may perform the data masking operation inhibiting third data DQ<33:48> input to the electronic device 120 from being stored into the cell array (223 or 225 of FIG. 2) when a third masking signal DM<3>, which is activated, is input to the electronic device 120. In some embodiments, the words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Figure 2:
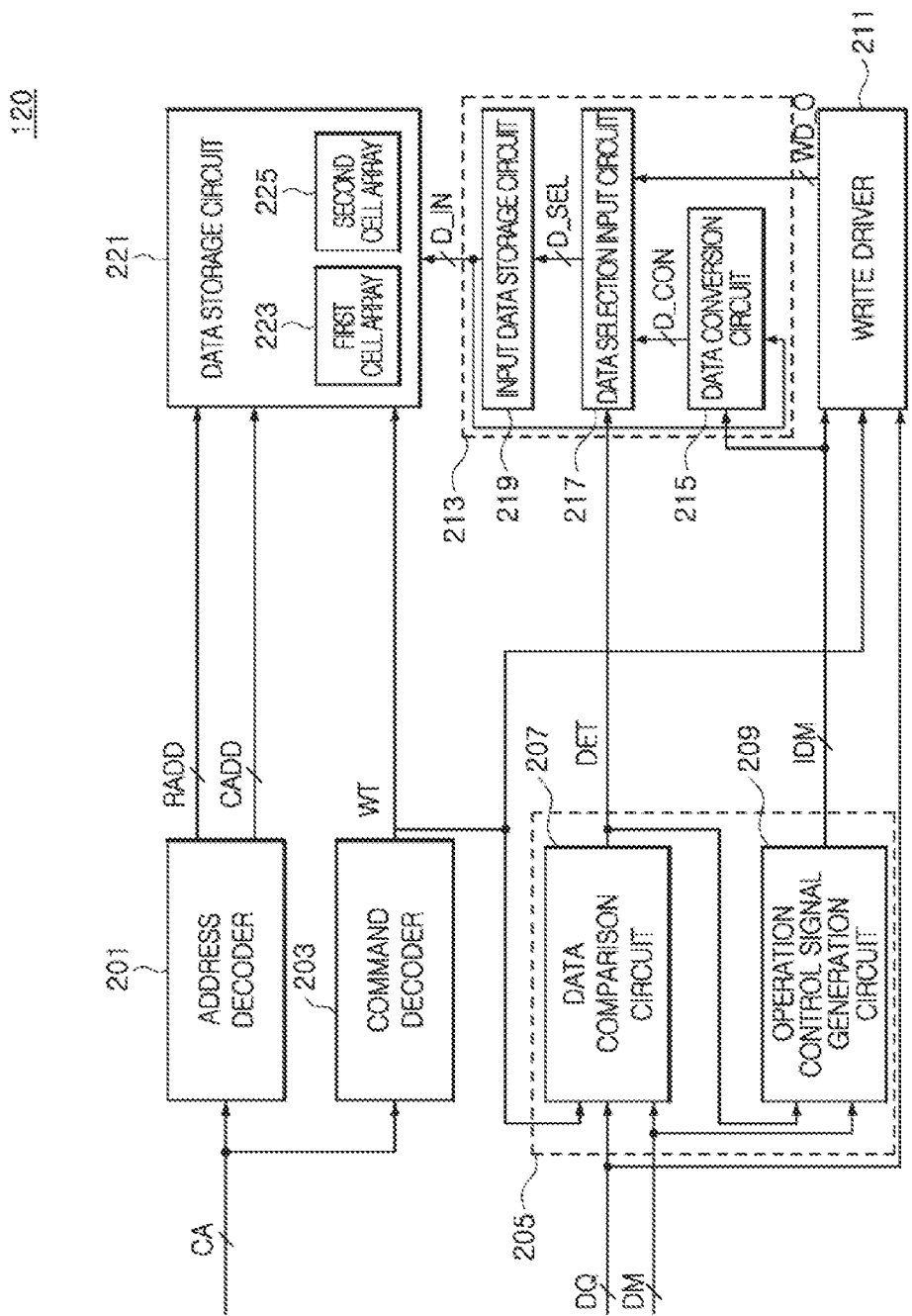
FIG. 2 is a block diagram illustrating a configuration of an example of an electronic device included in the electronic system illustrated in FIG. 1.

The electronic device 120 according to the present embodiments may activate an internal masking signal (IDM of FIG. 2) to perform the data masking operation when a pattern of the data DQ input to the electronic device 120 during the write operation is the predetermined pattern and may convert the input data (D_IN of FIG. 2) latched during the previous write operation to store the converted input data into the cell array (223 or 225 of FIG. 2). As a result, it may be possible to reduce an amount of a current which is consumed during the write operation.

FIG. 2 is a block diagram illustrating a configuration of the electronic device 120. As illustrated in FIG. 2, the electronic device 120 may include an address decoder 201, a command decoder 203, the operation control circuit 205, a write driver 211, the input data generation circuit 213, and the data storage circuit 221.

The address decoder 201 may generate a row address RADD and a column address CADD based on the command/address signal CA. The address decoder 201 may decode the command/address signal CA to generate the row address RADD and the column address CADD.

The command decoder 203 may generate a write signal WT based on the command/address signal CA. The command decoder 203 may decode the command/address signal CA to generate the write signal WT for performing the write operation. A logic level combination of the command/address signal CA for generating the write signal WT may be set to be different according to the embodiments. In addition, the number of bits included in the command/address signal CA may be set to be different according to the embodiments.

The operation control circuit 205 may include a data comparison circuit 207 and an operation control signal generation circuit 209. The operation control circuit 205 may generate a detection signal DET and the internal masking signal IDM based on the data DQ, the masking signal DM, and the write signal WT. The detection signal DET may be activated to activate the internal masking signal IDM. The internal masking signal IDM may be activated to perform the data masking operation that inhibits the data DQ from being stored into the first cell array 223 or the second cell array 225 included in the data storage circuit 221.

The operation control circuit 205 may receive the masking signal DM inactivated during the write operation and may inactivate the detection signal DET and the internal masking signal IDM when the data DQ input to the operation control circuit 205 does not have the predetermined pattern. The operation control circuit 205 may receive the masking signal DM inactivated during the write operation and may activate the detection signal DET and the internal masking signal IDM when the data DQ input to the operation control circuit 205 have the predetermined pattern. The operation control circuit 205 may inactivate the detection signal DET and may activate the internal masking signal IDM when the masking signal DM activated during the write operation is input to the operation control circuit 205.

The data comparison circuit 207 may generate the detection signal DET based on the masking signal DM and the data DQ. The data comparison circuit 207 may detect a pattern of the data DQ to activate the detection signal DET if the data DQ have the predetermined pattern when the masking signal DM is inactivated during the write operation. The write operation may include a first write operation and a second write operation, and the second write operation may be successively performed after the first write operation is performed.

The data comparison circuit 207 may compare the data DQ input during the first write operation with the data DQ input during the second write operation to activate the detection signal DET when the data DQ input during the second write operation have the predetermined pattern. The predetermined pattern of the data DQ may be set to be different according to the embodiments. For example, the data comparison circuit 207 may activate the detection signal DET when the data DQ input during the second write operation are inverted data of the data DQ input during the first write operation. For example, the data comparison circuit 207 may activate the detection signal DET when the data DQ input during the first write operation have a logic level combination of '00110011' and the data DQ input during the second write operation have a logic level combination of '11001100'.

The data comparison circuit 207 may inactivate the detection signal DET when the data comparison circuit 207 receives the masking signal DM inactivated during the write operation and the data DQ input to the data comparison circuit 207 do not have the predetermined pattern. The data comparison circuit 207 may activate the detection signal DET when the data comparison circuit 207 receives the masking signal DM inactivated during the write operation and the data DQ input to the data comparison circuit 207 have the predetermined pattern. The data comparison circuit 207 may inactivate the detection signal DET when the data comparison circuit 207 receives the masking signal DM activated during the write operation. A configuration and an operation of the data comparison circuit 207 will be described below with reference to FIG. 3 later.

The operation control signal generation circuit 209 may generate the internal masking signal IDM from the masking signal DM based on the detection signal DET. The operation control signal generation circuit 209 may activate the internal masking signal IDM when the masking signal DM or the detection signal DET is activated.

The operation control signal generation circuit 209 may receive the masking signal DM inactivated during the write operation to inactivate the internal masking signal IDM when the data DQ do not have the predetermined pattern. The operation control signal generation circuit 209 may receive the masking signal DM inactivated during the write operation to activate the internal masking signal IDM when the data DQ have the predetermined pattern. The operation control signal generation circuit 209 may activate the internal masking signal IDM when the masking signal DM activated during the write operation is input to the operation control signal generation circuit 209. A configuration and an operation of the operation control signal generation circuit 209 will be described below with reference to FIG. 4 later.

The write driver 211 may generate a drive data WD_O from the data DQ based on the write signal WT and the internal masking signal IDM. The write signal WT may be activated to enable the write driver 211. The write driver 211 may interrupt generation of the drive data WD_O by performing the data masking operation inhibiting the data DQ from being stored into the first cell array 223 or the second cell array 225 when the internal masking signal IDM is activated during the write operation. A configuration and an operation of the write driver 211 will be described below with reference to FIG. 5 later.

The input data generation circuit 213 may include a data conversion circuit 215, a data selection input circuit 217, and an input data storage circuit 219. The input data generation circuit 213 may generate the input data D_IN based on the internal masking signal IDM, the detection signal DET, and the drive data WD_O. The input data generation circuit 213 may convert the input data D_IN based on the internal masking signal IDM to generate converted data D_CON. The input data generation circuit 213 may select either the drive data WD_O or the converted data D_CON based on the detection signal DET to generate selected data D_SEL. The input data generation circuit 213 may latch the selected data D_SEL to generate the input data D_IN and may latch the input data D_IN to store the latched data of the input data D_IN. The input data generation circuit 213 may output the input data D_IN to the data storage circuit 221.

The input data generation circuit 213 may output the drive data WD_O as the input data D_IN based on the internal masking signal IDM and the detection signal DET which are inactivated when the masking signal DM is inactivated during the write operation and the data DQ do not have the predetermined pattern. The input data generation circuit 213 may convert the input data D_IN to generate the converted data D_CON and may output the converted data D_CON as the input data D_IN, based on the internal masking signal IDM and the detection signal DET which are activated when the masking signal DM is inactivated during the write operation and the data DQ have the predetermined pattern. The input data generation circuit 213 may output the drive data WD_O as the input data D_IN based on the detection signal DET which is inactivated when the masking signal DM is activated during the write operation.

The data conversion circuit 215 may convert the input data D_IN based on the internal masking signal IDM during the write operation to generate the converted data D_CON. The data conversion circuit 215 may convert logic levels of the input data D_IN into logic levels of the data DQ when the internal masking signal IDM is activated. The data conversion circuit 215 may convert a logic level combination of the input data D_IN to generate the converted data D_CON having the same logic level combination as the data DQ based on the internal masking signal IDM during the write operation. The data conversion circuit 215 may convert logic levels of the input data D_IN latched during the first write operation into logic levels of the data DQ input during the second write operation. The data conversion circuit 215 may convert a logic level combination of the input data D_IN latched during the first write operation into a logic level combination of the data DQ input during the second write operation. For example, when the input data D_IN latched during the first write operation have a logic level combination of '00110011' and the data DQ input during the second write operation have a logic level combination of '11001100', the data conversion circuit 215 may convert a logic level combination of the latched input data D_IN into a logic level combination of '11001100'.

The data conversion circuit 215 may output the input data D_IN as the converted data D_CON without converting the input data D_IN based on the internal masking signal IDM which is inactivated when the masking signal DM is inactivated during the write operation and the data DQ do not have the predetermined pattern. The data conversion circuit 215 may convert a logic level combination of the input data D_IN into a logic level combination of the data DQ to output the converted input data as the converted data D_CON, based on the internal masking signal IDM which is activated when the masking signal DM is inactivated and the data DQ have the predetermined pattern. The data conversion circuit 215 may convert a logic level combination of the input data D_IN into a logic level combination of the data DQ to output the converted input data as the converted data D_CON, based on the internal masking signal IDM which is activated when the masking signal DM is activated. A configuration and an operation of the data conversion circuit 215 will be described below with reference to FIG. 6 later.

The data selection input circuit 217 may select either the drive data WD_O or the converted data D_CON based on the detection signal DET during the write operation to generate the selected data D_SEL. The data selection input circuit 217 may select the converted data D_CON to output the converted data D_CON as the selected data D_SEL when the detection signal DET is activated during the write operation. The data selection input circuit 217 may select the drive data WD_O to output the drive data WD_O as the selected data D_SEL when the detection signal DET is inactivated during the write operation.

The data selection input circuit 217 may select the drive data WD_O to output the drive data WD_O as the selected data D_SEL based on the detection signal DET which is inactivated when the masking signal DM is inactivated during the write operation and the data DQ do not have the predetermined pattern. The data selection input circuit 217 may select the converted data D_CON to output the converted data D_CON as the selected data D_SEL based on the detection signal DET which is activated when the masking signal DM is inactivated during the write operation and the data DQ have the predetermined pattern. The data selection input circuit 217 may select the drive data WD_O to output the drive data WD_O as the selected data D_SEL based on the detection signal DET which is inactivated when the masking signal DM is activated. A configuration and an operation of the data selection input circuit 217 will be described below with reference to FIG. 6 later.

The input data storage circuit 219 may latch the selected data D_SEL to output the latched data of the selected data D_SEL as the input data D_IN and may latch the input data D_IN to store the input data D_IN, during the write operation. The input data storage circuit 219 may output the input data D_IN to the data storage circuit 221. A configuration and an operation of the input data storage circuit 219 will be described below with reference to FIG. 6 later.

The data storage circuit 221 may include the first cell array 223 and the second cell array 225. The data storage circuit 221 may store the input data D_IN into the cell array 223 or 225 based on the row address RADD, the column address CADD, and the write signal WT during the write operation.

The data storage circuit 221 may store the input data D_IN into the first cell array 223 corresponding to the row address RADD and the column address CADD during the first write operation and may store the input data D_IN into the second cell array 225 corresponding to the row address RADD and the column address CADD during the second write operation.

Figure 3:
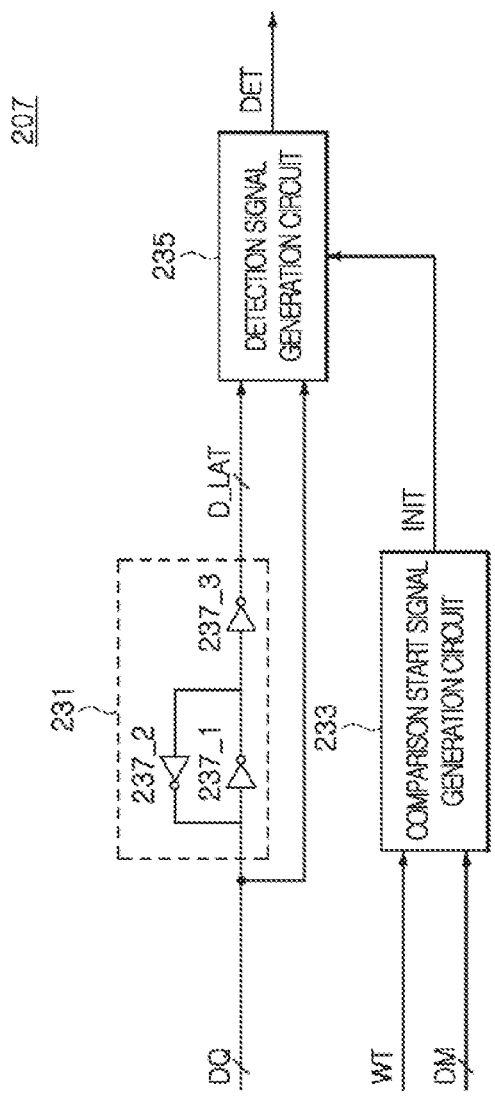
FIG. 3 illustrates an example of a data comparison circuit included in the electronic device illustrated in FIG. 2.

FIG. 3 illustrates an example of the data comparison circuit 207. As illustrated in FIG. 3, the data comparison circuit 207 may include a latch data generation circuit 231, a comparison start signal generation circuit 233, and a detection signal generation circuit 235.

The latch data generation circuit 231 may latch the data DQ to output the latched data of the data DQ as latch data D_LAT during the write operation. The latch data generation circuit 231 may include inverters 237_1, 237_2, and 237_3. The inverter 237_1 may inversely buffer the data DQ. The inverter 237_2 may inversely buffer an output signal of the inverter 237_1 to feedback the inversely buffered signal of the output signal of the inverter 237_1 to an input terminal of the inverter 237_1. The inverter 237_3 may inversely buffer an output signal of the inverter 237_1 to output the inversely buffered signal of the output signal of the inverter 237_1 as the latch data D_LAT.

The comparison start signal generation circuit 233 may receive the write signal WT which is activated and the masking signal DM which is inactivated, thereby generating a comparison start signal INIT which is activated while the write operation is performed. The comparison start signal generation circuit 233 may inactivate the comparison start signal INIT when the write signal WT is activated and the masking signal DM is activated during the write operation.

The detection signal generation circuit 235 may compare a pattern of the data DQ with a pattern of the latch data D_LAT to generate the detection signal DET which is activated if the data DQ have the predetermined pattern when the comparison start signal INIT is activated during the write operation. The detection signal generation circuit 235 may inactivate the detection signal DET when the comparison start signal INIT is inactivated during the write operation. The latch data D_LAT may have a logic level combination of the data DQ input during the first write operation when the comparison start signal INIT is activated during the second write operation. The predetermined pattern of the data DQ may be set to be different according to the embodiments. For example, the detection signal generation circuit 235 may activate the detection signal DET when the data DQ have an inverted logic level combination of the latch data D_LAT. For example, the detection signal generation circuit 235 may activate the detection signal DET when the latch data D_LAT have a logic level combination of '11001100' and the data DQ have a logic level combination of '00110011' during the write operation.

Figure 4:
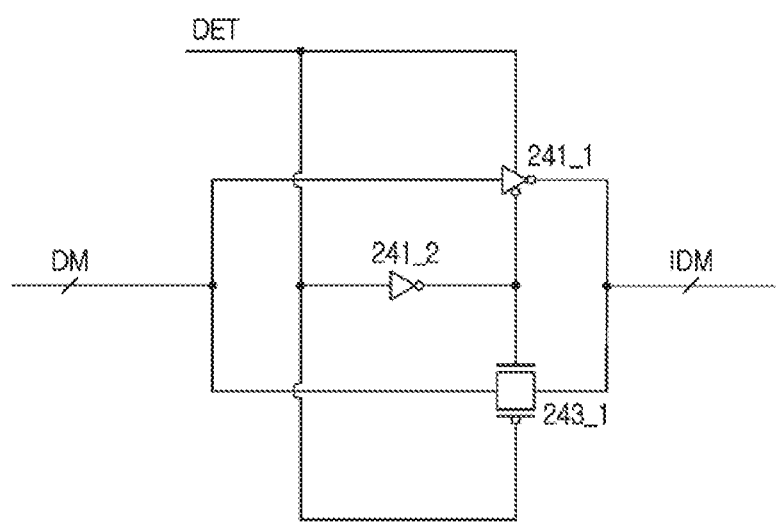
FIG. 4 is a circuit diagram illustrating an example of an operation control signal generation circuit included in the electronic device illustrated in FIG. 2.

FIG. 4 is a circuit diagram illustrating an example of the operation control signal generation circuit 209. As illustrated in FIG. 4, the operation control signal generation circuit 209 may invert the masking signal DM to generate the internal masking signal IDM when the detection signal DET is activated to have a logic "high" level. The operation control signal generation circuit 209 may activate the internal masking signal IDM for performing the data masking operation to a logic "high" level when the detection signal DET or the masking signal DM is activated to have a logic "high" level during the write operation.

The operation control signal generation circuit 209 may output the masking signal DM as it is to inactivate the internal masking signal IDM, based on the detection signal DET inactivated to have a logic "low" level when the masking signal DM is inactivated to have a logic "low" level and the data DQ do not have the predetermined pattern during the write operation. The operation control signal generation circuit 209 may invert the masking signal DM to activate the internal masking signal IDM, based on the detection signal DET activated to have a logic "high" level when the masking signal DM is inactivated to have a logic "low" level and the data DQ have the predetermined pattern during the write operation. The operation control signal generation circuit 209 may output the masking signal DM as it is to activate the internal masking signal IDM, based on the detection signal DET inactivated to have a logic "low" level when the masking signal DM is activated to have a logic "high" level during the write operation.

The operation control signal generation circuit 209 may include inverters 241_1 and 241_2 and a transfer gate 243_1. The inverter 241_1 may be enabled when the detection signal DET is activated to have a logic "high" level and may be disabled when the detection signal DET is inactivated to have a logic "low" level. The inverter 241_1 may inversely buffer the masking signal DM to generate the internal masking signal IDM when the detection signal DET is activated to have a logic "high" level. The inverter 241_2 may inversely buffer the detection signal DET. The transfer gate 243_1 may output the masking signal DM as it is to generate the internal masking signal IDM when the detection signal DET is inactivated to have a logic "low" level.

Figure 5:
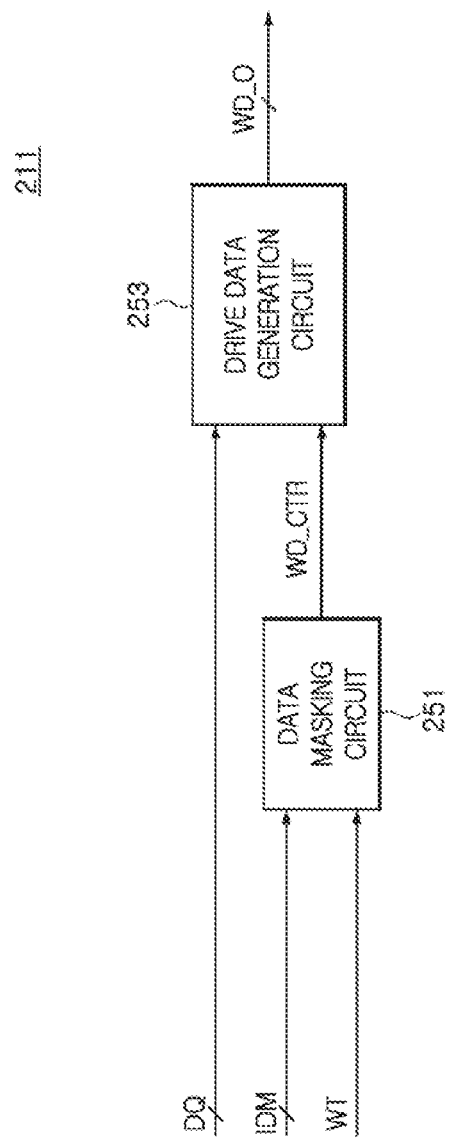
FIG. 5 is a block diagram illustrating an example of a write driver included in the electronic device illustrated in FIG. 2.

FIG. 5 is a block diagram illustrating an example of the write driver 211. As illustrated in FIG. 5, the write driver 211 may include a data masking circuit 251 and a drive data generation circuit 253.

The data masking circuit 251 may generate a driver control signal WD_CTR which is inactivated when the write signal WT is activated and the masking signal DM is activated during the write operation. The driver control signal WD_CTR may be activated to enable the drive data generation circuit 253. The data masking circuit 251 may inactivate the driver control signal WD_CTR to perform the data masking operation when the internal masking signal IDM is activated.

The drive data generation circuit 253 may generate the drive data WD_O from the data DQ when the driver control signal WD_CTR is activated during the write operation. The drive data generation circuit 253 may inhibit the drive data WD_O from being generated when the driver control signal WD_CTR is inactivated.

Figure 6:
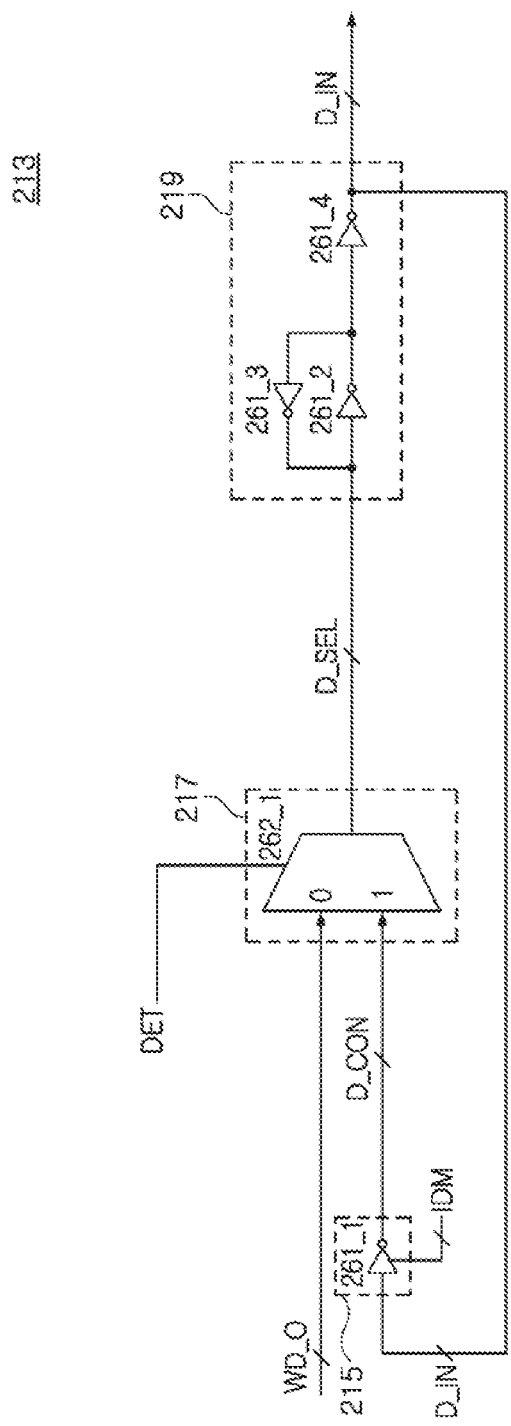
FIG. 6 is a circuit diagram illustrating an example of an input data generation circuit included in the electronic device illustrated in FIG. 2.

FIG. 6 is a circuit diagram illustrating an example of the input data generation circuit 213. As illustrated in FIG. 6, the input data generation circuit 213 may include the data conversion circuit 215, the data selection input circuit 217, and the input data storage circuit 219.

The data conversion circuit 215 may convert a logic level combination of the input data D_IN into a logic level combination of the data DQ to generate the converted data D_CON when the internal masking signal IDM is activated to have a logic "high" level. The data conversion circuit 215 may invert logic levels of the input data D_IN to generate the converted data D_CON when the internal masking signal IDM is activated to have a logic "high" level during the write operation. The data conversion circuit 215 may invert logic levels of the input data D_IN latched during the first write operation to convert the input data D_IN into the converted data D_CON having the same logic levels as the data DQ input during the second write operation. For example, when the input data D_IN latched during the first write operation have a logic level combination of '00110011' and the data DQ input during the second write operation have a logic level combination of '11001100', the data conversion circuit 215 may invert logic levels of the input data D_IN latched during the first write operation to generate the converted data D_CON having a logic level combination of '11001100'.

The data conversion circuit 215 may output the input data D_IN as the converted data D_CON based on the internal masking signal IDM which is inactivated when the masking signal DM is inactivated during the write operation and the data DQ do not have the predetermined pattern. The data conversion circuit 215 may invert the logic levels of the input data D_IN to generate the converted data D_CON having the same logic levels as the data DQ based on the internal masking signal IDM which is activated when the masking signal DM is inactivated and the data DQ have the predetermined pattern. The data conversion circuit 215 may invert the logic levels of the input data D_IN to generate the converted data D_CON having the same logic levels as the data DQ based on the internal masking signal IDM which is activated when the masking signal DM is activated.

The data conversion circuit 215 may include an inverter 261_1. The inverter 261_1 may be enabled when the internal masking signal IDM is activated to have a logic "high" level and may be disabled when the internal masking signal IDM is inactivated to have a logic "low" level. The inverter 261_1 may inversely buffer the input data D_IN to generate the converted data D_CON.

The data selection input circuit 217 may include a multiplexer 262_1. The multiplexer 262_1 may output the converted data D_CON as the selected data D_SEL when the detection signal DET used as a selection signal has a logic "high" level and may output the drive data WD_O as the selected data D_SEL when the detection signal DET has a logic "low" level.

The input data storage circuit 219 may include inverters 261_2, 261_3, and 261_4. The inverter 261_2 may inversely buffer the selected data D_SEL. The inverter 261_3 may inversely buffer an output signal of the inverter 261_2 to feedback the inversely buffered signal of the output signal of the inverter 261_2 to an input terminal of the inverter 261_2. The inverter 261_4 may inversely buffer an output signal of the inverter 261_2 to output the inversely buffered signal of the output signal of the inverter 261_2 as the input data D_IN.

The write operation of the electronic device 120 illustrated in FIG. 2 will be described hereinafter with reference to FIGS. 7 to 13.

Figure 7:
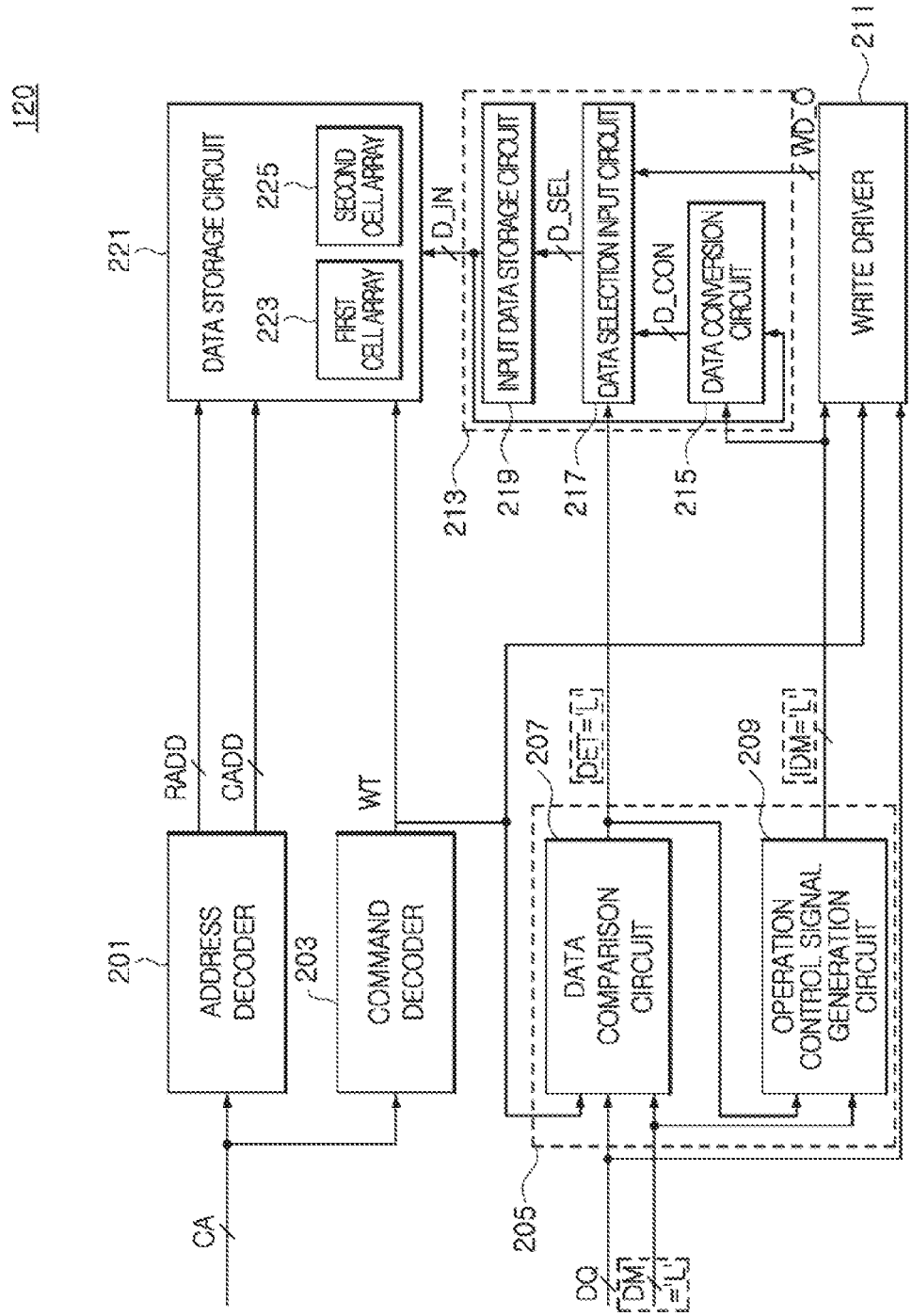
FIGS. 7, 8, 9, 10, 11, 12, and 13 illustrate a write operation performed by the electronic device illustrated in FIG. 2.
Figure 8:
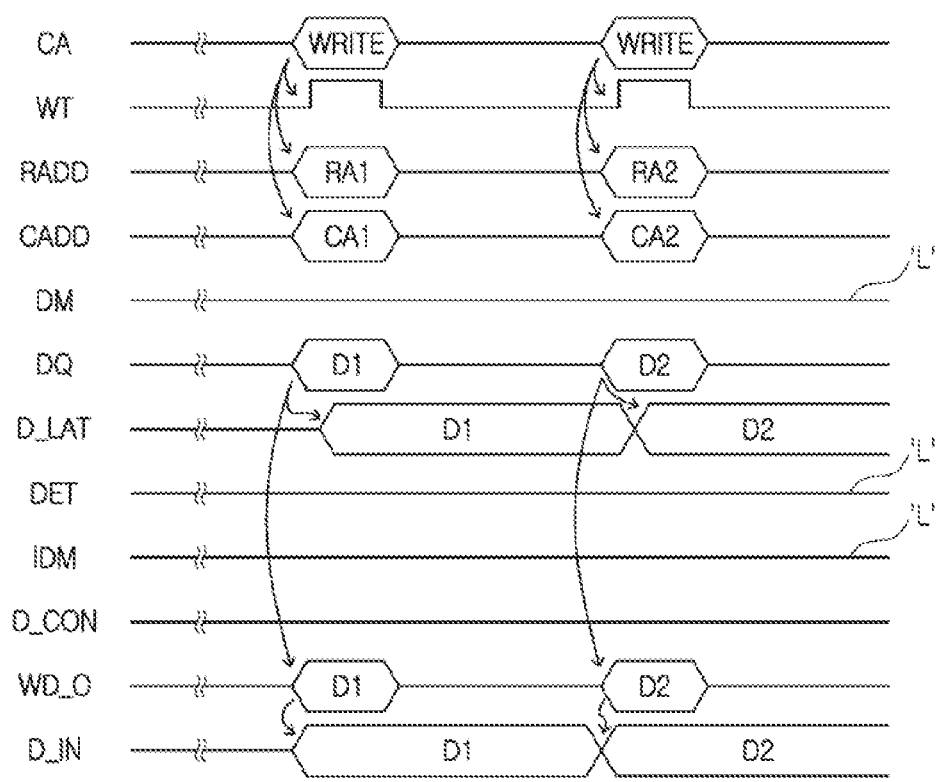

FIGS. 7 and 8 illustrate an operation of the electronic device 120 when the first and second write operations are successively performed, the second write operation is performed in response to the masking signal DM which is inactivated, and the data DQ do not have the predetermined pattern.

As illustrated in FIG. 8, the address decoder 201 may receive the command/address signal CA to generate the row address RADD having a logic level combination 'RA1' and the column address CADD having a logic level combination 'CA1' during the first write operation. The command decoder 203 may receive the command/address signal CA having a logic level combination for performing the write operation to activate the write signal WT during the first write operation. The operation control circuit 205 may latch the data DQ having a logic level combination 'D1' to generate the latch data D_LAT during the first write operation. The input data generation circuit 213 may latch the drive data WD_O having the logic level combination 'D1' to generate the input data D_IN during the first write operation. The data storage circuit 221 may store the input data D_IN into the first cell array 223 corresponding to the row address RADD having the logic level combination 'RA1' and the column address CADD having the logic level combination 'CA1'.

Referring to FIGS. 7 and 8, the address decoder 201 may receive the command/address signal CA to generate the row address RADD having a logic level combination 'RA2' and the column address CADD having a logic level combination 'CA2' during the second write operation. The command decoder 203 may receive the command/address signal CA having a logic level combination for performing the write operation to activate the write signal WT during the second write operation. The operation control circuit 205 may receive the masking signal DM inactivated to have a logic "low(L)" level to compare the data DQ having a logic level combination 'D2' with the latch data D_LAT having the logic level combination 'D1' during the second write operation. The operation control circuit 205 may generate the detection signal DET and the internal masking signal IDM which are inactivated to have a logic "low(L)' level when the data DQ received during the second write operation do not have the predetermined pattern. The input data generation circuit 213 may select and output the drive data WD_O having the logic level combination 'D2' as the input data D_IN based on the detection signal DET which is inactivated. The data storage circuit 221 may store the input data D_IN into the second cell array 225 corresponding to the row address RADD having the logic level combination 'RA2' and the column address CADD having the logic level combination 'CA2'.

Figure 9:
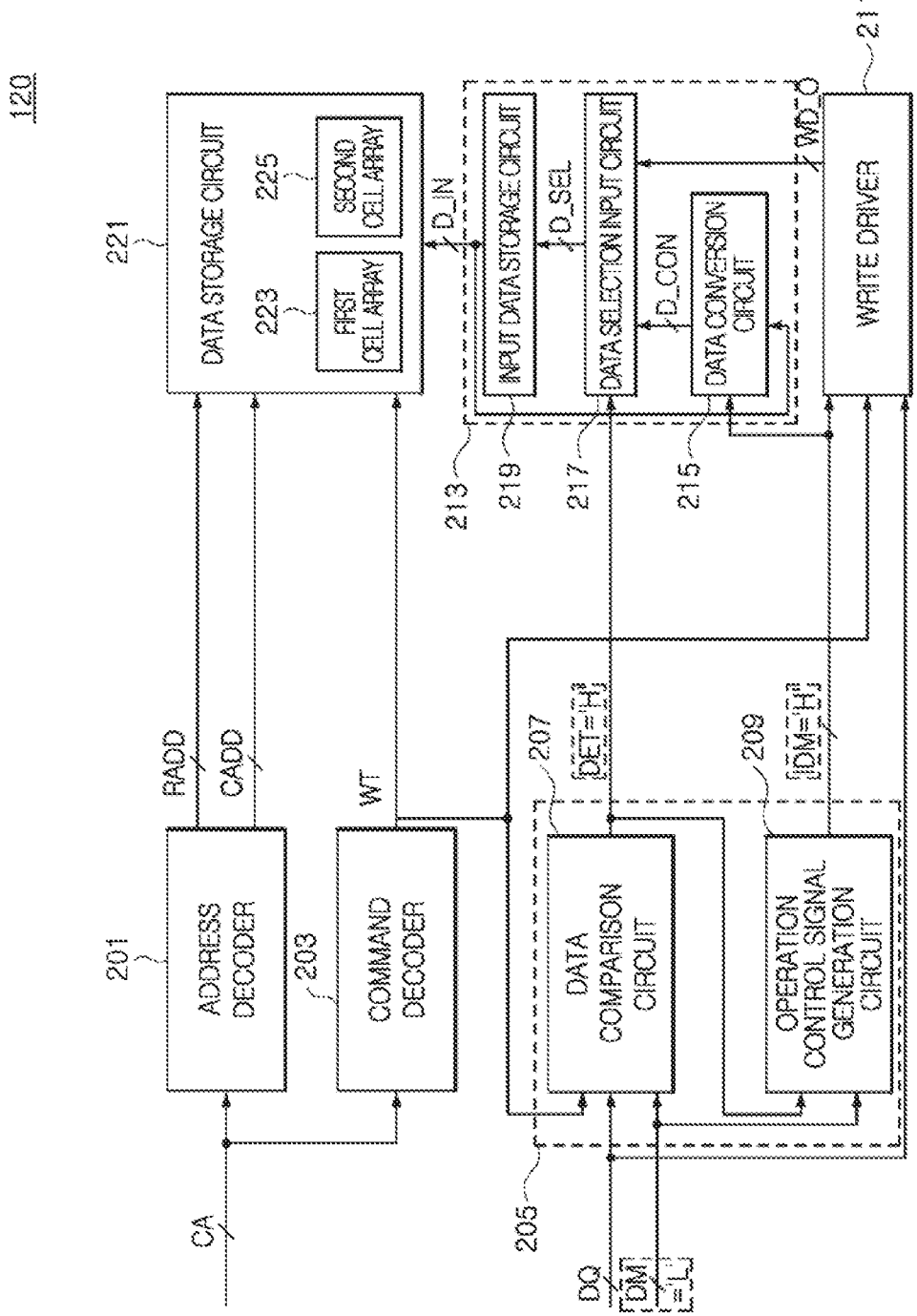
Figure 10:
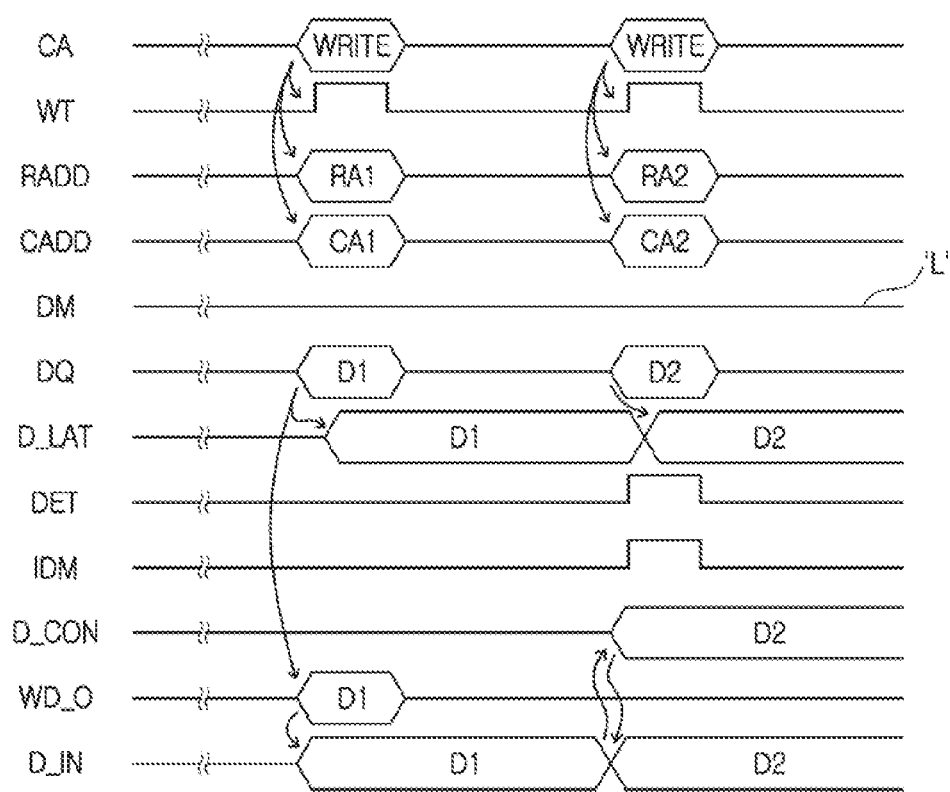

FIGS. 9 and 10 illustrate an operation of the electronic device 120 when the first and second write operations are successively performed, the second write operation is performed in response to the masking signal DM which is inactivated, and the data DQ have the predetermined pattern.

As illustrated in FIG. 10, the address decoder 201 may receive the command/address signal CA to generate the row address RADD having the logic level combination 'RA1' and the column address CADD having the logic level combination 'CA1' during the first write operation. The command decoder 203 may receive the command/address signal CA having a logic level combination for performing the write operation to activate the write signal WT during the first write operation. The operation control circuit 205 may latch the data DQ having the logic level combination 'D1' to generate the latch data D_LAT during the first write operation. The input data generation circuit 213 may latch the drive data WD_O having the logic level combination 'D1' to generate the input data D_IN during the first write operation. The data storage circuit 221 may store the input data D_IN into the first cell array 223 corresponding to the row address RADD having the logic level combination 'RA1' and the column address CADD having the logic level combination 'CA1'.

Referring to FIGS. 9 and 10, the address decoder 201 may receive the command/address signal CA to generate the row address RADD having the logic level combination 'RA2' and the column address CADD having the logic level combination 'CA2' during the second write operation. The command decoder 203 may receive the command/address signal CA having a logic level combination for performing the write operation to activate the write signal WT during the second write operation. The operation control circuit 205 may receive the masking signal DM inactivated to have a logic "low(L)" level to compare the data DQ having the logic level combination 'D2' with the latch data D_LAT having the logic level combination 'D1' during the second write operation. The operation control circuit 205 may generate the detection signal DET and the internal masking signal IDM which are activated to have a logic "high(H)' level when the data DQ received during the second write operation have the predetermined pattern. The write driver 211 may receive the internal masking signal IDM, which is activated, to perform the data masking operation. The input data generation circuit 213 may convert the input data D_IN, which is latched to have the logic level combination 'D1' during the first write operation, based on the activated internal masking signal IDM to generate the converted data D_CON having the logic level combination 'D2', The input data generation circuit 213 may select and output the converted data D_CON as the input data D_IN based on the detection signal DET which is activated. The data storage circuit 221 may store the input data D_IN into the second cell array 225 corresponding to the row address RADD having the logic level combination 'RA2' and the column address CADD having the logic level combination 'CA2'.

Figure 11:
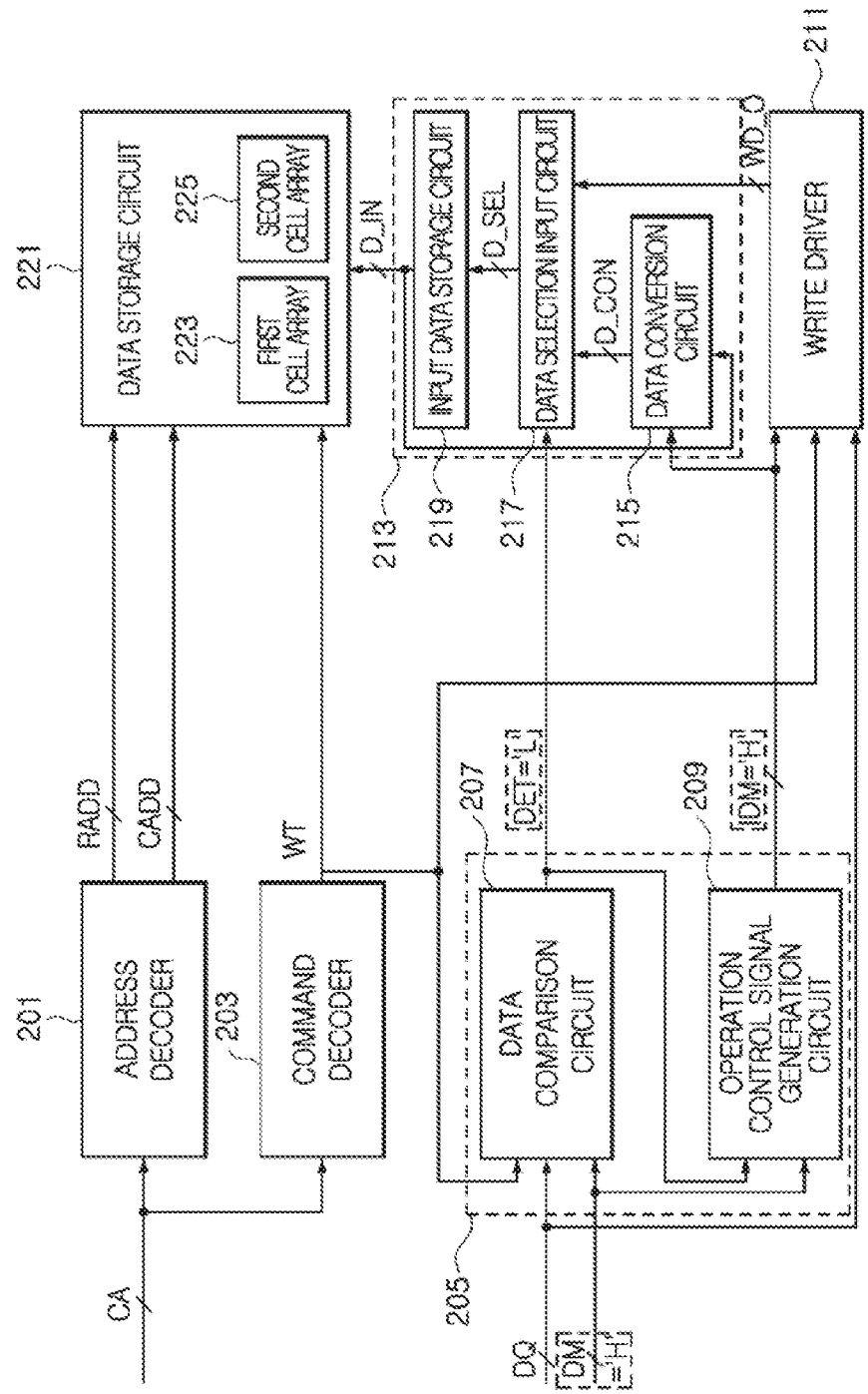
Figure 12:
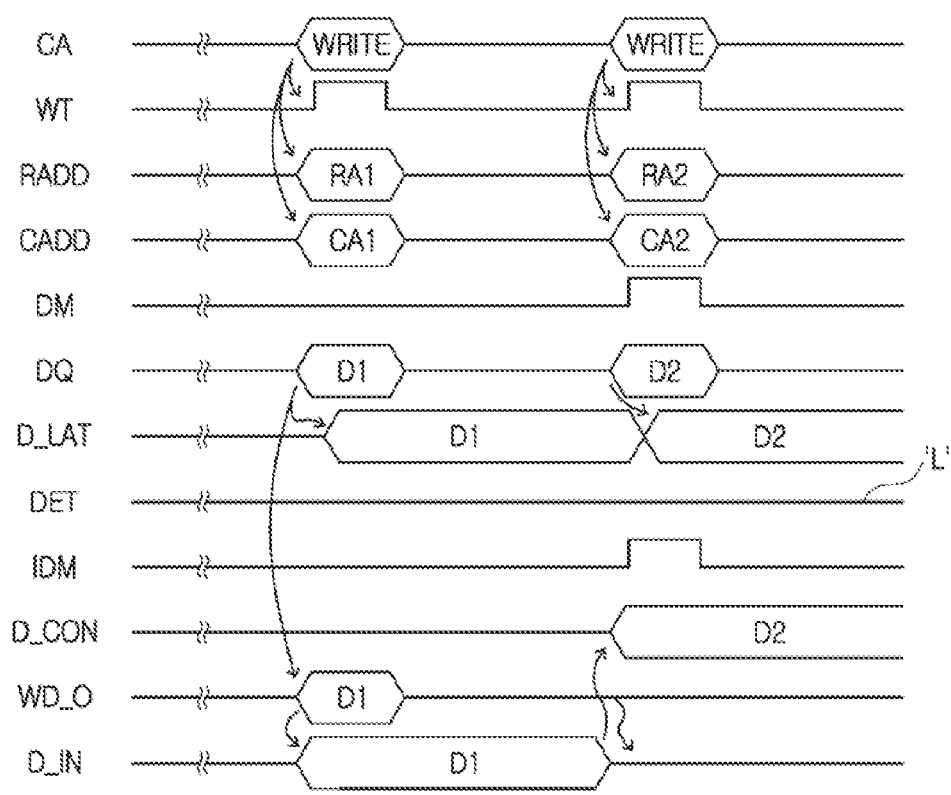

FIGS. 11 and 12 illustrate an operation of the electronic device 120 in conjunction with a case that the first and second write operations are successively performed and the second write operation is performed in response to the masking signal DM which is activated.

As illustrated in FIG. 12, the address decoder 201 may receive the command/address signal CA to generate the row address RADD having the logic level combination 'RA1' and the column address CADD having the logic level combination 'CA1' during the first write operation. The command decoder 203 may receive the command/address signal CA having a logic level combination for performing the write operation to activate the write signal WT during the first write operation. The operation control circuit 205 may latch the data DQ having the logic level combination 'D1' to generate the latch data D_LAT during the first write operation. The input data generation circuit 213 may latch the drive data WD_O having the logic level combination 'D1' to generate the input data D_IN during the first write operation. The data storage circuit 221 may store the input data D_IN into the first cell array 223 corresponding to the row address RADD having the logic level combination 'RA1' and the column address CADD having the logic level combination 'CA1'.

Referring to FIGS. 11 and 12, the address decoder 201 may receive the command/address signal CA to generate the row address RADD having the logic level combination 'RA2' and the column address CADD having the logic level combination 'CA2' during the second write operation. The command decoder 203 may receive the command/address signal CA having a logic level combination for performing the write operation to activate the write signal WT during the second write operation. The operation control circuit 205 may receive the masking signal DM activated to have a logic "high(H)" level during the second write operation to generate the detection signal DET inactivated to have a logic "low(L)" level and the internal masking signal IDM activated to have a logic "high(H)' level. The write driver 211 may receive the internal masking signal IDM, which is activated, to perform the data masking operation. The input data generation circuit 213 may convert the input data D_IN, which is latched to have the logic level combination 'D1' during the first write operation, based on the activated internal masking signal IDM to generate the converted data D_CON having the logic level combination 'D2'. However, the input data generation circuit 213 may select and output the drive data WD_O, which is masked, as the input data D_IN based on the detection signal DET which is inactivated.

Figure 13:
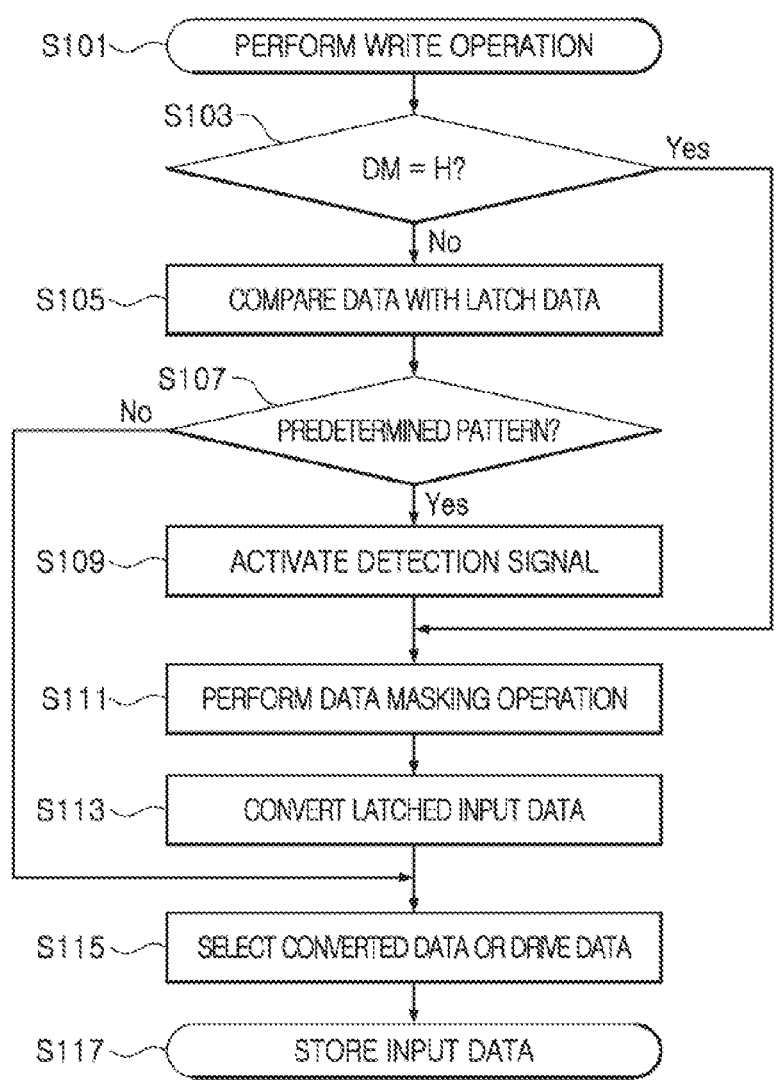

FIG. 13 is a flowchart illustrating the write operation performed by the electronic device 120 illustrated in FIG. 2.

First, the electronic device 120 may receive the command/address signal CA having a logic level combination for performing the write operation, the data DQ, and the masking signal DM from the controller 110 to perform the write operation (see a step S101). When the masking signal DM activated to have a logic "high(H)" level is input to the operation control circuit 205 at a step S103, the operation control circuit 205 may generate the internal masking signal IDM which is activated to perform the data masking operation at a step S111. When the masking signal DM inactivated to have a logic "low(L)" level is input to the operation control circuit 205 at the step S103, the operation control circuit 205 may compare a pattern of the data DQ with a pattern of the latch data D_LAT (see a step S105). When the data DQ have the predetermined pattern at a step S107 as a comparison result of the step S105, the data comparison circuit 207 may activate the detection signal DET (see a step S109). In contrast, when the data DQ do not have the predetermined pattern at the step S107 as a comparison result of the step S105, the data comparison circuit 207 may inactivate the detection signal DET. The operation control signal generation circuit 209 may generate the internal masking signal IDM which is activated when the masking signal DM or the detection signal DET is activated.

Next, when the internal masking signal IDM is activated, the write driver 211 may perform the data masking operation (see the step S111). When the internal masking signal IDM is activated, the data conversion circuit 215 may convert the input data D_IN latched during a previous write operation to generate the converted data D_CON (see a step S113). The data selection input circuit 217 may select and output the converted data D_CON as the selected data D_SEL when the detection signal DET is activated and may select and output the drive data WD_O as the selected data D_SEL when the detection signal DET is inactivated (see a step S115).

Finally, the input data storage circuit 219 may latch the selected data D_SEL to generate the input data D_IN and may latch and store the input data D_IN. The data storage circuit 221 may store the input data D_IN into the second cell array 223 or 225 to terminate the write operation (see a step S117).

As described above, the electronic device 120 according to an embodiment may activate the internal masking signal IDM to perform the data masking operation and may convert the input data D_IN latched during a previous write operation to store the converted data of the input data D_IN into the cell array 223 or 225 when the data DQ input during a current write operation have the predetermined pattern. As a result, it may be possible to reduce power consumption of the electronic device 120 during the write operation.

What is claimed is:

1. An electronic device comprising:
an operation control circuit configured to generate a detection signal and an internal masking signal based on a masking signal and data during a write operation; and
an input data generation circuit configured to convert input data based on the internal masking signal to generate converted data and configured to select and output either the converted data or drive data as the input data, which are input to a data storage circuit, based on the detection signal,
wherein the write operation includes a first write operation and a second write operation;

wherein the second write operation is successively performed after the first write operation is performed; and
wherein the detection signal is activated when the data input during the second write operation have a predetermined pattern when the data input during the first write operation is compared with the data input during the second write operation.

2. The electronic device of claim 1, wherein the masking signal is output from a controller to perform a data masking operation.

3. The electronic device of claim 1, wherein the detection signal is activated when the data input during the second write operation have inverted logic levels of the data input during the first write operation.

4. The electronic device of claim 1, wherein the internal masking signal is activated to perform a data masking operation when at least one of the masking signal and the detection signal is activated.

5. The electronic device of claim 4, wherein the operation control circuit inverts the masking signal to generate the internal masking signal when the detection signal is activated.

6. The electronic device of claim 1, further comprising a write driver configured to generate the drive data from the data based on the internal masking signal.

7. The electronic device of claim 1, wherein the input data generation circuit includes:
a data conversion circuit configured to convert the input data based on the internal masking signal to generate the converted data;
a data selection input circuit configured to select and output one of the drive data and the converted data as selected data based on the detection signal; and
an input data storage circuit configured to latch the selected data to generate the input data and configured to latch the input data.

8. The electronic device of claim 7, wherein the data conversion circuit is configured to convert logic levels of the input data into logic levels of the data when the internal masking signal is activated.

9. The electronic device of claim 8,
wherein the data conversion circuit is configured to convert logic levels of the input data latched during the first write operation into logic levels of the data input during the second write operation.

10. The electronic device of claim 7, wherein the data selection input circuit selects the converted data to output the converted data as the selected data when the detection signal is activated and selects the drive data to output the drive data as the selected data when the detection signal is inactivated.

11. The electronic device of claim 1,
wherein the data storage circuit is configured to store the input data into a first cell array corresponding to a row address and a column address during the first write operation and is configured to store the input data into a second cell array corresponding to the row address and the column address during the second write operation.

12. An electronic device comprising:
a data comparison circuit configured to detect a pattern of data based on a masking signal to generate a detection signal when the data have a predetermined pattern;
an operation control signal generation circuit configured to generate an internal masking signal from the masking signal based on the detection signal; and a data conversion circuit configured to convert input data based on the internal masking signal to generate converted data, wherein a write operation includes a first write operation and a second write operation;

wherein the second write operation is successively performed after the first write operation is performed; and wherein the detection signal is activated when the data input during the second write operation have the predetermined pattern when the data input during the first write operation is compared with the data input during the second write operation.

13. The electronic device of claim 12, wherein the masking signal is output from a controller to perform a data masking operation.

14. The electronic device of claim 12, wherein the data comparison circuit is configured to detect whether the data have the predetermined pattern when the masking signal is inactivated.

15. The electronic device of claim 12, wherein the detection signal is activated when the data input during the second write operation have inverted logic levels of the data input during the first write operation.

16. The electronic device of claim 12, wherein the internal masking signal is activated to perform a data masking operation when at least one of the masking signal and the detection signal is activated.

17. The electronic device of claim 16, wherein the operation control signal generation circuit inverts the masking signal to generate the internal masking signal when the detection signal is activated.

18. The electronic device of claim 12, wherein the data conversion circuit is configured to convert logic levels of the input data into logic levels of the data when the internal masking signal is activated.

\* \* \* \* \*